United States Patent
Lim et al.

(10) Patent No.: US 11,290,666 B2
(45) Date of Patent: Mar. 29, 2022

(54) MULTI-BETA PIXEL CIRCUIT AND IMAGE SENSOR CIRCUIT USING SAME

(71) Applicant: PixArt Imaging Incorporation, HsinChu (TW)

(72) Inventors: Wooi-Kip Lim, Penang (MY); Shan-Chong Tan, Penang (MY)

(73) Assignee: PIXART IMAGING INCORPORATION, Hsinchu (TW)

( * ) Notice: Subject to any disclaimer, the term of this patent is extended or adjusted under 35 U.S.C. 154(b) by 148 days.

(21) Appl. No.: 16/879,655

(22) Filed: May 20, 2020

(65) Prior Publication Data
US 2021/0368113 A1 Nov. 25, 2021

(51) Int. Cl.
*H01L 27/146* (2006.01)
*H04N 5/355* (2011.01)
*H04N 5/378* (2011.01)

(52) U.S. Cl.
CPC ....... *H04N 5/355* (2013.01); *H01L 27/14681* (2013.01); *H04N 5/378* (2013.01)

(58) Field of Classification Search
None
See application file for complete search history.

(56) References Cited

U.S. PATENT DOCUMENTS 6,529,241 B1 * 3/2003 Clark ................ H01L 27/14609
250/208.1

* cited by examiner

*Primary Examiner* — Mark T Monk
(74) *Attorney, Agent, or Firm* — Tung & Associates

(57) ABSTRACT

An image sensor uses a pixel circuit which includes a BJT phototransistor having multiple selectable beta values. The BJT is one semiconductor device includes: a substrate having a first conductivity type; a first well having the first conductivity type; a collector electrode having the first conductivity type in the first well; a second well having a first concentration of a second conductivity type; a first emitter electrode having the first conductivity type in the second well; a base electrode having the second conductivity type in the second well; a third well having a second concentration of the second conductivity type, wherein the second concentration is different from the first concentration; and a second emitter electrode having the first conductivity type in the third well.

10 Claims, 5 Drawing Sheets

MULTI-BETA PIXEL CIRCUIT AND IMAGE SENSOR CIRCUIT USING SAME

BACKGROUND OF THE INVENTION

Field of Invention

The present invention relates to a pixel circuit which includes a BJT (bipolar junction transistor) phototransistor having more than one selectable beta values, and an image sensor circuit using such a pixel circuit.

Description of Related Art

FIG. 1 shows a prior art pixel circuit 10 for use in an image sensor circuit. The pixel circuit 10 includes a BJT phototransistor 11, integration capacitors INT and INTD, a shutter control stage 12 and a readout stage 13. The terminals PBB and INTN control the shutter control stage 12 to transfer charges in the integration capacitor INT through the BJT phototransistor 11 to ground (GND) (i.e., exposure), and the terminals RD and RST control the readout stage 13 to read out the difference between the voltages of integration capacitors INT and INTD, to generate the output signals OUT and OUTD.

More specifically, referring to FIGS. 1 and 2A-2B, wherein FIGS. 2A-2B are top view and cross-section view of the BJT phototransistor 11, respectively, when light shines on the pixel circuit 10 and in particular on the BJT phototransistor 11, a photo current (base current IB), consisting of electron holes, is generated within the depletion region of the reverse-biased base/collector junction (i.e., the junction between the base N-implant) and the collector P-Substrate. The accumulated electrons at the base node causes its potential to drop relative to that of the emitter. As a result, the BJT emitter to base junction becomes forward-biased and large amount of positive charge carriers (holes) are injected from E (emitter) towards B (base). Most of these positive charge carriers are swept into the collector junction, thus generating an amplified collector current (IC) flowing from E (emitter) towards C (collector, P-Substrate). This amplified current IC discharges the integration capacitor INT and is subsequently read out as the pixel signal.

The current gain factor of the BJT phototransistor 11, referred to as "beta", is given by the ratio of the collector current to the base photo current (BJT beta=IC/IB). This BJT current gain factor is determined by the dosage of the base N-implant and the base junction width.

However, there is a dilemma between a good beta and a good signal/noise ratio (SNR). When the beta is higher, the sensitivity of the circuit is better but the SNR becomes worse; if a better SNR is desired, then a lower beta needs to be selected. It is often difficult to determine which beta value is proper at the circuit design phase because the SNR is related to the application environment of the circuit.

In view of the above, the present invention proposes a pixel circuit which includes a BJT phototransistor having more than one selectable beta values, to solve the dilemma. The present invention also proposes and an image sensor circuit using such a pixel circuit.

SUMMARY OF THE INVENTION

From one perspective, the present invention provides a pixel circuit for use in an image sensor, comprising: a bipolar junction transistor (BJT) having a base, a collector, and a plurality of emitters, wherein the BJT is a phototransistor whose current generates a pixel signal for the pixel circuit; a shutter control stage configured to operably control an exposure of the BJT; a readout stage configured to operably read out the pixel signal; and one or more switches configured to respectively control corresponding one or more of the plurality of emitters; whereby the BJT has multiple selectable beta values by controlling the one or more switches.

In one embodiment, the pixel circuit further includes a storage device for storing the pixel signal.

In one embodiment, a total number of the switches corresponds to a total number of the emitters.

In one embodiment, a total number of the switches corresponds to a total number of the emitters minus one.

In one embodiment, the BJT is one semiconductor device including: a substrate having a first conductivity type; a first well having the first conductivity type; a collector electrode having the first conductivity type in the first well; a second well having a first concentration of a second conductivity type; a first emitter electrode having the first conductivity type in the second well; a base electrode having the second conductivity type in the second well; a third well having a second concentration of the second conductivity type, wherein the second concentration is different from the first concentration; and a second emitter electrode having the first conductivity type in the third well.

From another perspective, the present invention provides an image sensor, comprising: a plurality of pixel circuits configured to operably sense an intensity of light to generate pixel signals; and column and row selectors to select the pixel circuits to output the pixel signals as an image output signal; wherein each of the pixel circuits includes: a BJT having a base, a collector, and a plurality of emitters, wherein the BJT is a phototransistor whose current generates the pixel signal for the corresponding pixel circuit; a shutter control stage configured to operably control an exposure of the BJT; a readout stage configured to operably read out the pixel signal; and one or more switches configured to respectively control corresponding one or more of the plurality of emitters; whereby the BJT has multiple selectable beta values by controlling the one or more switches.

The objectives, technical details, features, and effects of the present invention will be better understood with regard to the detailed description of the embodiments below.

DESCRIPTION OF THE PREFERRED EMBODIMENTS

The drawings as referred to throughout the description of the present invention are for illustration only, to show the interrelations among the circuit components and the interrelations among the layout areas, but not drawn according to actual scale.

Figure 1:
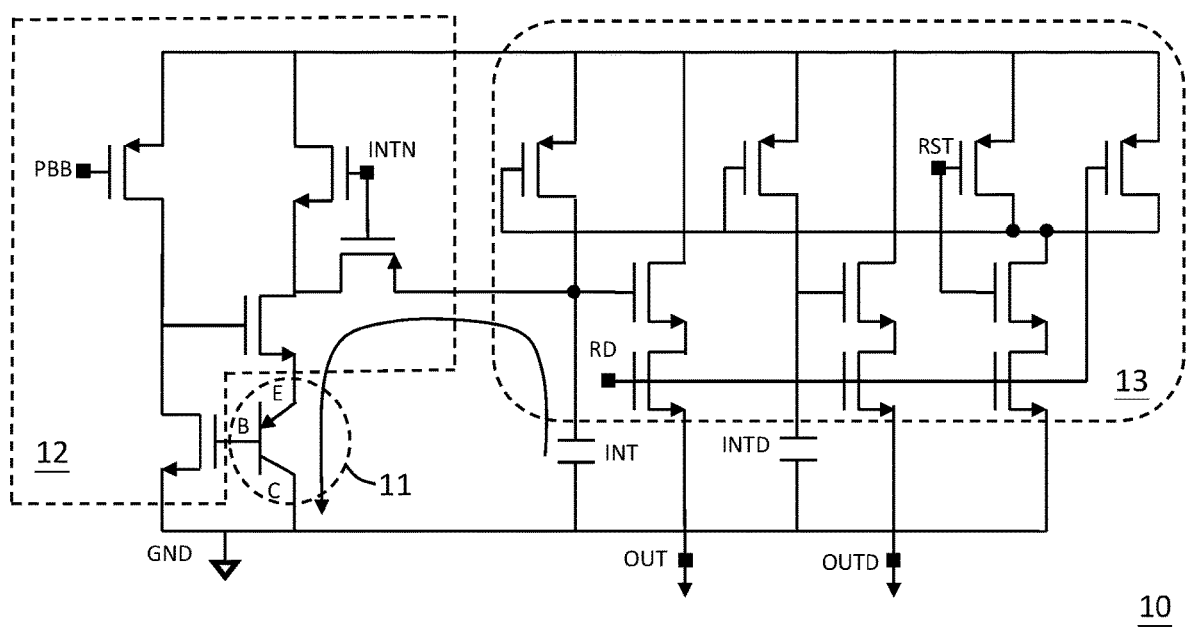
FIG. 1 shows a schematic diagram of a prior art pixel circuit.
Figure 2A:
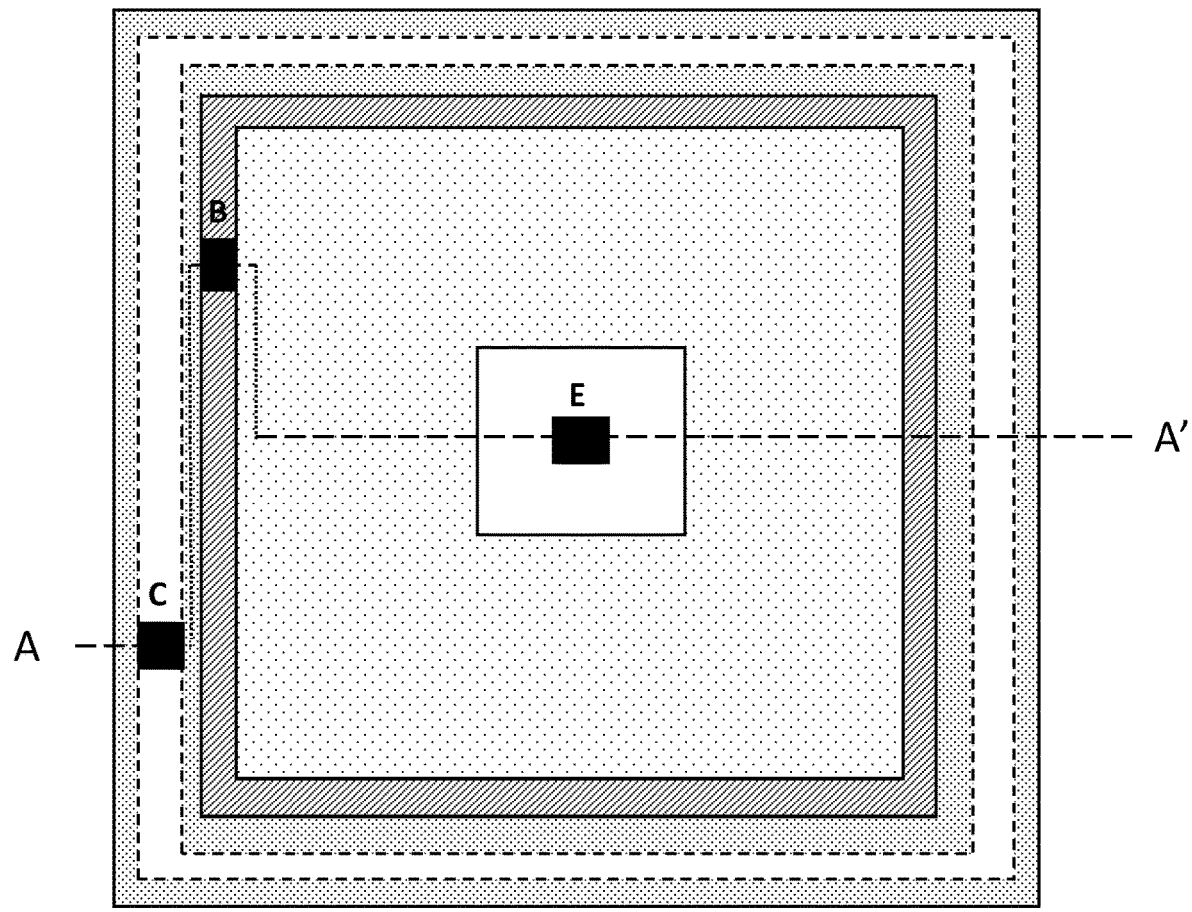
FIGS. 2A and 2B show top view and cross-section view of a BJT phototransistor in the prior art of FIG. 1, respectively.
Figure 2B:
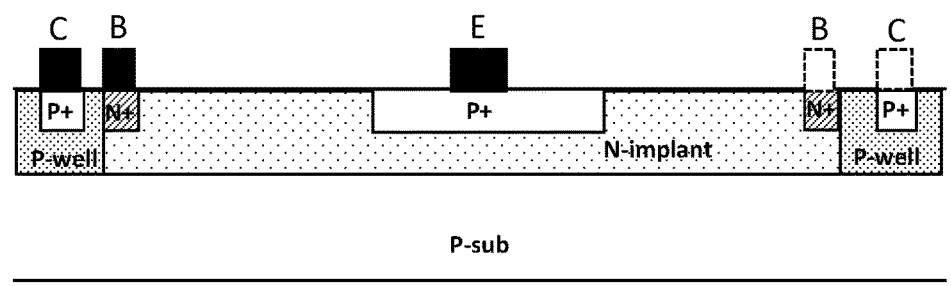
Figure 3:
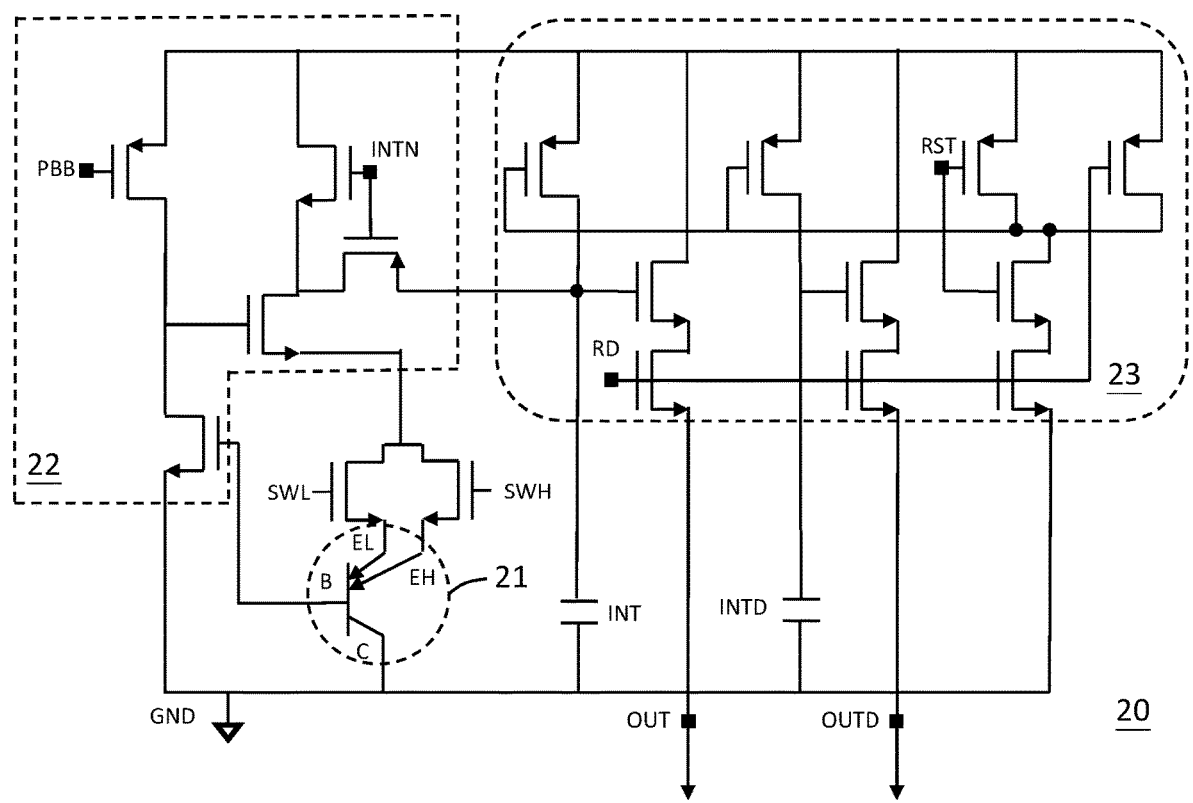
FIG. 3 shows a schematic diagram of a pixel circuit according to one embodiment of the present invention.

FIG. 3 shows a schematic diagram of a pixel circuit 100 according to one embodiment of the present invention. The pixel circuit 20 is for use in an image sensor circuit. The pixel circuit 20 includes a BJT phototransistor 21 which has multiple selectable beta values, switches SWL and SWH, integration capacitors INT and INTD, a shutter control stage 22 and a readout stage 23. The BJT phototransistor 21 is a phototransistor whose current generates a pixel signal for the pixel circuit 20. The shutter control stage 22 is configured to operably control an exposure of the BJT phototransistor 21 to transfer charges in the integration capacitor INT through the BJT phototransistor 21 to ground (GND). The readout stage 13 reads out the difference between the voltages of integration capacitors INT and INTD, to generate the output signals OUT and OUTD.

Figure 4A:
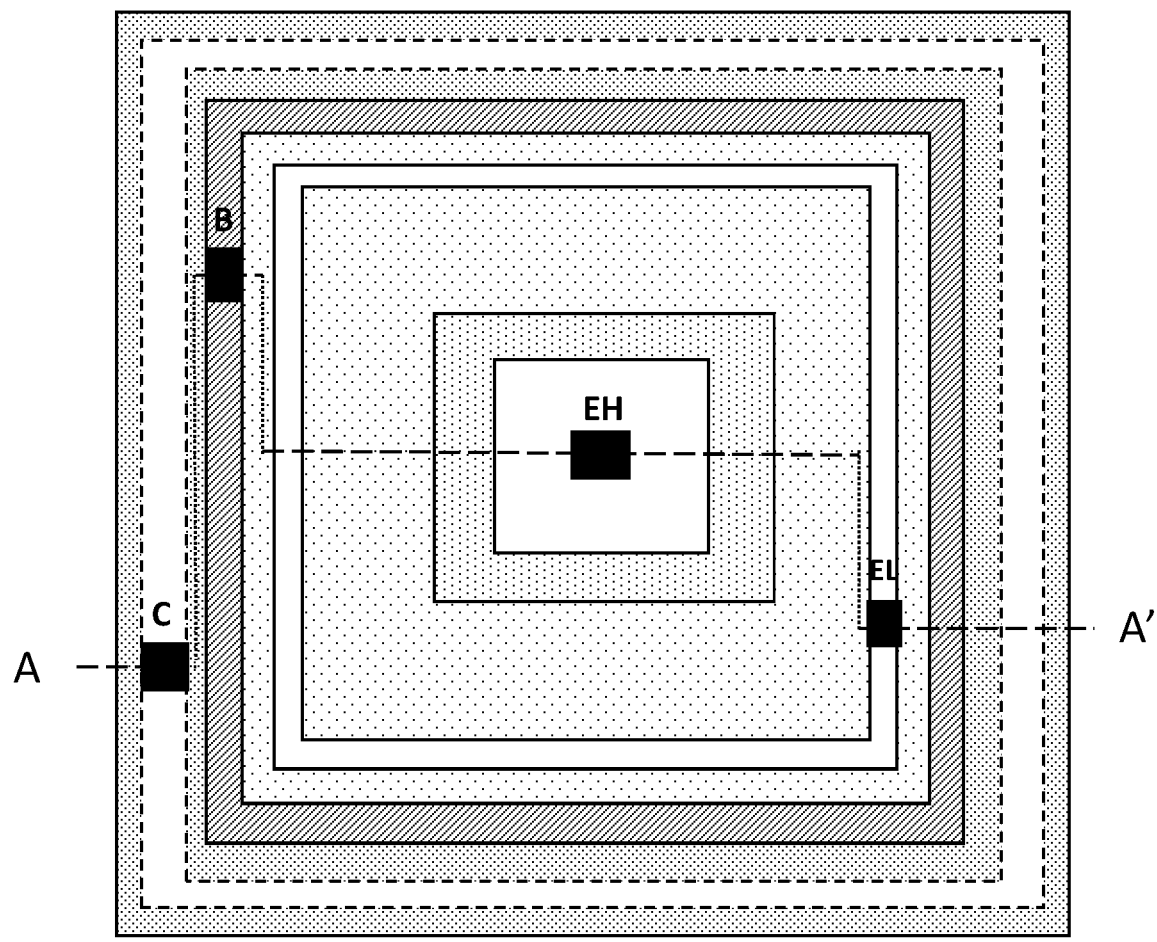
FIGS. 4A and 4B show top view and cross-section view of a BJT phototransistor according to one embodiment of the present invention, respectively.
Figure 4B:
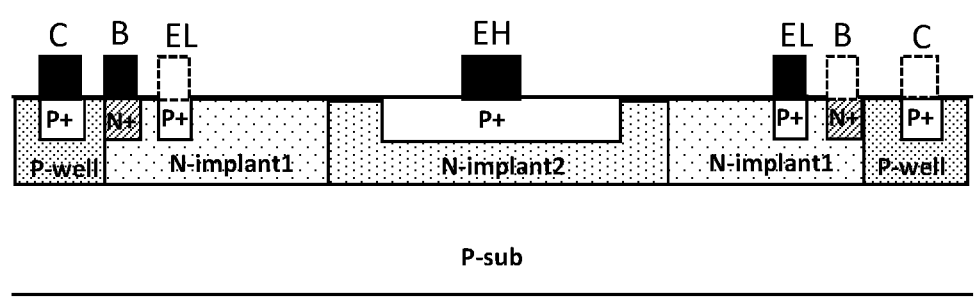

One important feature of the present invention is that the BJT phototransistor 21 has multiple selectable beta values. Please refer to FIGS. 4A and 4B in conjunction with FIG. 3. The BJT phototransistor 21 has plural emitters EL and EH, wherein EL is a low beta emitter and EH is a high beta emitter. In one embodiment, the low beta emitter EL includes a P+ pickup node which sits in an N-type well (N-implant1), whereas, the high beta emitter EH includes a P+ pickup node which sits in another N-type well (N-implant2). In one embodiment, the dosage of the N-type well N-implant1 is higher than the dosage of the N-type well N-implant2. Preferably, the two N-type wells are in contact with each other at the boundary in between, to form a continuous N-well structure such that the base pickup node can be shared by the high and low beta BJTs. The collector includes the P-type substrate and a P+ pickup node which sits in a P-type well (P-implant).

Two switches SWL and SWH respectively control the current flows into the low beta emitter EL and the high beta emitter EH, respectively.

Due to different N-type implant dosages, the high beta emitter EH has a much higher current flow (from emitter to collector) as compared to the low beta emitter EL. The beta value of the BJT phototransistor 21 can be selected by switching ON/OFF the current paths through the high beta emitter EH and the low beta emitter EL. More specifically, if the switch SWL is OFF and the switch SWH is ON, a highest beta is achieved. If the switch SWL is ON and the switch SWH is OFF, a lowest beta is achieved. if both switches SWL and SWH are ON, an intermediate beta is achieved.

Because the present invention provides selectable beta values, a user of the circuit can determine a best trade-off between the desired beta (hence the desired sensitivity of the circuit) and the desired SNR.

Figure 5A:
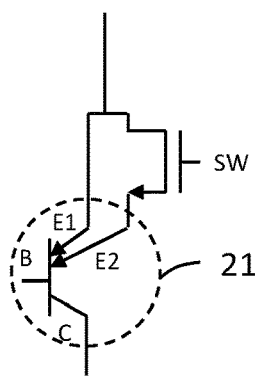
FIGS. 5A-5C show schematic diagrams of BJT phototransistors according to several embodiments of the present invention.
Figure 5B:
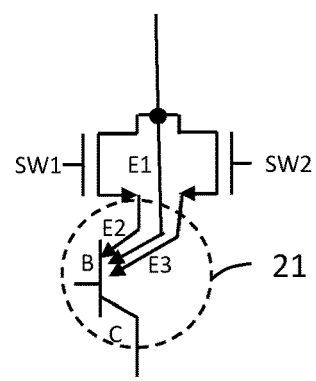
Figure 5C:
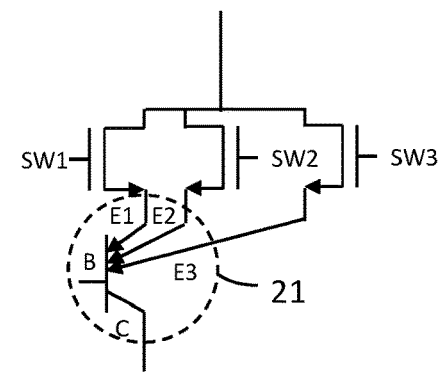

Please refer to FIGS. 5A-5C, which show several embodiments of the BJT phototransistors according to the present invention.

Referring to FIG. 5A, please note that one of the emitters (E1 in this embodiment) can be always in conduction. In this case, the ON/OFF of the emitter E2 can alter the beta of the BJT phototransistor 21 so that the BJT phototransistor 21 has two beta values.

Referring to FIG. 5B, please note that there can be three (or more) emitters. In this embodiment, the emitter E1 is always in conduction. The emitters E2 and E3 can be turned ON/OFF individually to alter the beta of the BJT phototransistor 21 so that the BJT phototransistor 21 has four beta values.

Referring to FIG. 5C, In this embodiment, there are three emitters E1, E2 and E3, which can be turned ON/OFF individually to alter the beta of the BJT phototransistor 21 so that the BJT phototransistor 21 has seven beta values (excluding zero).

Certainly there can be more than three emitters if it is desired to provide more selectable beta values.

In the embodiments of FIGS. 3 and 5C, the number of the switches corresponds to the number of the emitters. In the embodiments of FIGS. 5A and 5B, the number of the switches corresponds to the number of the emitters minus one.

Figure 6:
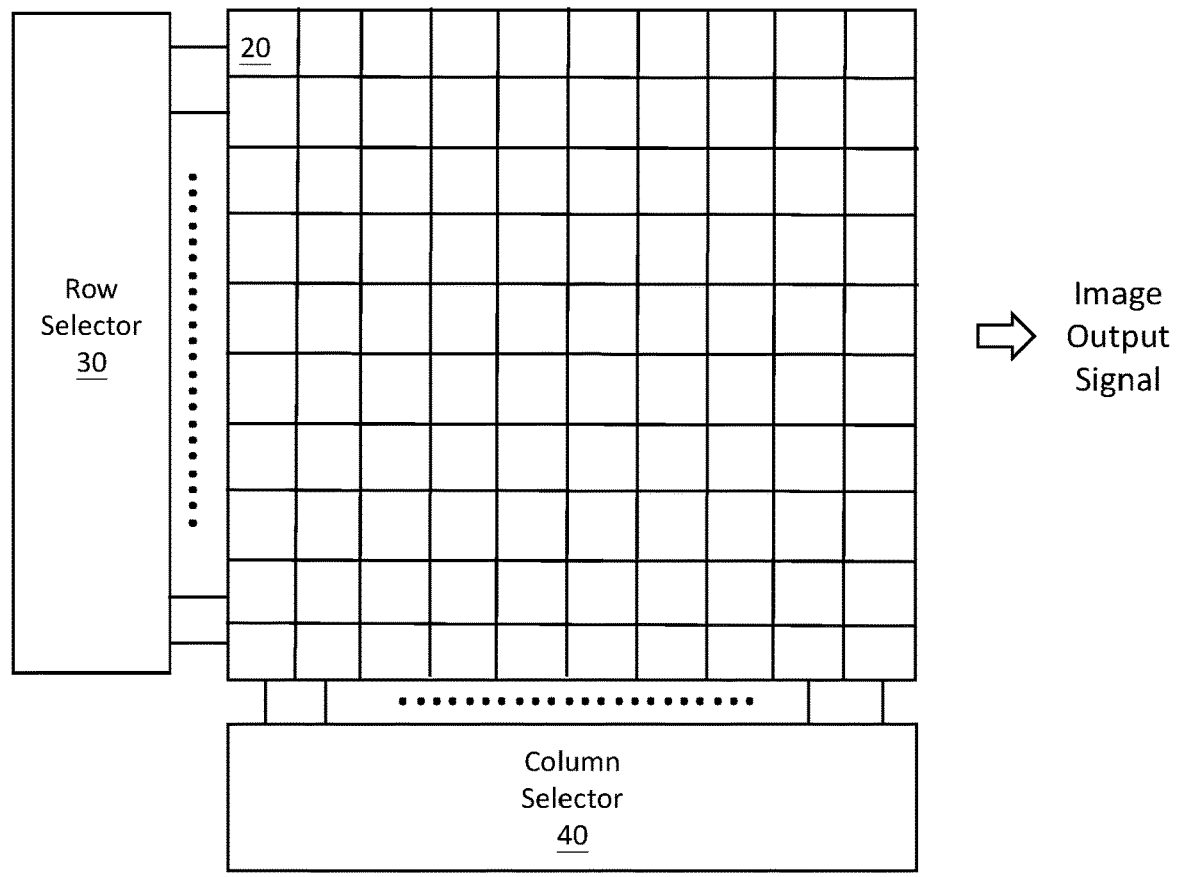
FIG. 6 shows a schematic diagram of an image sensor circuit according to one embodiment of the present invention.

Please refer to FIG. 6, which shows a schematic diagram of an image sensor circuit according to one embodiment of the present invention.

The image sensor circuit includes plural pixel circuits 20 arranged in an array by columns and rows, a row selector 30, and a column selector 40. The row selector 30 and the column selector 40 select the pixel circuit for example by a sequential order (i.e., scan), to generate an image output signal which includes an image frame of all pixel signals of the plural pixel circuits 20.

The present invention has been described in considerable detail with reference to certain preferred embodiments thereof. It should be understood that the description is for illustrative purpose, not for limiting the scope of the present invention. It is not limited for each of the embodiments described hereinbefore to be used alone; under the spirit of the present invention, two or more of the embodiments described hereinbefore can be used in combination. For example, two or more of the embodiments can be used together, or, a part of one embodiment can be used to replace a corresponding part of another embodiment. Furthermore, those skilled in this art can readily conceive variations and modifications within the spirit of the present invention. For example . . . . As another example, to perform an action "according to" a certain signal as described in the context of the present invention is not limited to performing an action strictly according to the signal itself, but can be performing an action according to a converted form or a scaled-up or down form of the signal, i.e., the signal can be processed by a voltage-to-current conversion, a current-to-voltage conversion, and/or a ratio conversion, etc. before an action is performed. The spirit of the present invention should cover all such and other modifications and variations, which should be interpreted to fall within the scope of the following claims and their equivalents.

What is claimed is:

1. A pixel circuit for use in an image sensor, comprising:
    a bipolar junction transistor (BJT) having a base, a collector, and a plurality of emitters, wherein the BJT is a phototransistor whose current generates a pixel signal for the pixel circuit;
    a shutter control stage configured to operably control an exposure of the BJT;
    a readout stage configured to operably read out the pixel signal; and
    one or more switches configured to respectively control corresponding one or more of the plurality of emitters;
    whereby the BJT has multiple selectable beta values by controlling the one or more switches.

2. The pixel circuit of claim 1, further including a storage device for storing the pixel signal.

3. The pixel circuit of claim 1, wherein a total number of the switches corresponds to a total number of the emitters.

4. The pixel circuit of claim 1, wherein a total number of the switches corresponds to a total number of the emitters minus one.

5. The pixel circuit of claim 1, wherein the BJT is one semiconductor device including:
- a substrate having a first conductivity type;
- a first well having the first conductivity type;
- a collector electrode having the first conductivity type in the first well;
- a second well having a first concentration of a second conductivity type;
- a first emitter electrode having the first conductivity type in the second well;
- a base electrode having the second conductivity type in the second well;
- a third well having a second concentration of the second conductivity type, wherein the second concentration is different from the first concentration; and
- a second emitter electrode having the first conductivity type in the third well.

6. An image sensor, comprising:
- a plurality of pixel circuits configured to operably sense an intensity of light to generate pixel signals; and
- column and row selectors to select the pixel circuits to output the pixel signals as an image output signal;
- wherein each of the pixel circuits includes:
  - a bipolar junction transistor (BJT) having a base, a collector, and a plurality of emitters, wherein the BJT is a phototransistor whose current generates the pixel signal for the corresponding pixel circuit;
  - a shutter control stage configured to operably control an exposure of the BJT;
  - a readout stage configured to operably read out the pixel signal; and
  - one or more switches configured to respectively control corresponding one or more of the plurality of emitters;
  - whereby the BJT has multiple selectable beta values by controlling the one or more switches.

7. The image sensor of claim 6, wherein each of the pixel circuits further includes a storage device for storing the pixel signal.

8. The image sensor of claim 6, wherein a total number of the switches corresponds to a total number of the emitters.

9. The image sensor of claim 6, wherein a total number of the switches corresponds to a total number of the emitters minus one.

10. The image sensor of claim 6, wherein the BJT is one semiconductor device including:
- a substrate having a first conductivity type;
- a first well having the first conductivity type;
- a collector electrode having the first conductivity type in the first well;
- a second well having a first concentration of a second conductivity type;
- a first emitter electrode having the first conductivity type in the second well;
- a base electrode having the second conductivity type in the second well;
- a third well having a second concentration of the second conductivity type, wherein the second concentration is different from the first concentration; and
- a second emitter electrode having the first conductivity type in the third well.

* * * * *